United States Patent
Jeddeloh

(10) Patent No.: US 9,223,391 B2
(45) Date of Patent: *Dec. 29, 2015

(54) APPARATUS POWER CONTROL

(71) Applicant: Micron Technology, Inc., Boise, ID (US)

(72) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/572,370

(22) Filed: Dec. 16, 2014

(65) Prior Publication Data

US 2015/0160712 A1    Jun. 11, 2015

Related U.S. Application Data

(63) Continuation of application No. 13/561,632, filed on Jul. 30, 2012, now Pat. No. 8,938,630.

(51) Int. Cl.
  *G06F 1/26* (2006.01)
  *G06F 1/32* (2006.01)
  *G06F 3/06* (2006.01)
  *G06F 9/50* (2006.01)

(52) U.S. Cl.
  CPC .............. *G06F 1/329* (2013.01); *G06F 1/3234* (2013.01); *G06F 3/0631* (2013.01); *G06F 9/5083* (2013.01); *Y02B 60/144* (2013.01)

(58) Field of Classification Search
  CPC ..... G06F 1/3234; G06F 1/329; G06F 3/0631; G06F 9/5083
  USPC .......................... 713/300, 310, 320; 711/5, 24
  See application file for complete search history.

(56) References Cited

U.S. PATENT DOCUMENTS

| | | | |
|---|---|---|---|
| 7,512,029 B2 | 3/2009 | Roohparvar | |
| 8,938,630 B2 * | 1/2015 | Jeddeloh | 713/300 |
| 2005/0216775 A1 | 9/2005 | Inoue | |
| 2010/0050007 A1 | 2/2010 | Jiang | |
| 2010/0128381 A1 | 5/2010 | Guthrie et al. | |
| 2010/0169687 A1 | 7/2010 | Kimura | |
| 2010/0211808 A1 | 8/2010 | Jeong et al. | |
| 2010/0275050 A1 | 10/2010 | Hong | |

\* cited by examiner

*Primary Examiner* — Michael J Brown
(74) *Attorney, Agent, or Firm* — Brooks, Cameron & Huebsch, PLLC

(57) ABSTRACT

The present disclosure includes apparatuses and methods for apparatus power control. A number of embodiments include determining a power profile for each of a number of commands in a command queue that are ready for execution and selecting a portion of the number of commands in the command queue for execution based on the power profiles of the number of commands to control power consumption in the apparatus.

19 Claims, 2 Drawing Sheets

APPARATUS POWER CONTROL

PRIORITY INFORMATION

This application is a Continuation of U.S. application Ser. No. 13/561,632, filed Jul. 30, 2012, the contents of which are included herein by reference.

TECHNICAL FIELD

The present disclosure relates generally to apparatuses, such as semiconductor memory devices, systems, and controllers, and related methods, and more particularly, to apparatus power control.

BACKGROUND

Memory devices are typically provided as internal, semiconductor, integrated circuits in computers or other electronic devices. There are many different types of memory including volatile and non-volatile memory. Volatile memory can require power to maintain its information, e.g., data, and includes random-access memory (RAM), dynamic random access memory (DRAM), synchronous dynamic random access memory (SDRAM), and static random access memory (SRAM) among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), resistive random access memory (RRAM), and phase change random access memory (PCRAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

An SSD can be used to replace hard disk drives as the main storage device for a computing system, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips. As one of ordinary skill in the art will appreciate, a memory chip can include a number of dies and/or logical units (LUNs), e.g., where a LUN can be one or more die. Each die can include a number of memory arrays and peripheral circuitry thereon. The memory arrays can include a number of memory cells organized into a number of physical pages, and the physical pages can be organized into a number of blocks. An array of flash memory cells can be programmed a page at a time and erased a block at a time. Operations, such as read, write, and erase operations, performed on an SSD can be limited by the amount of power available for performance of the operations by the memory devices in the SSD.

DETAILED DESCRIPTION

Figure 1:
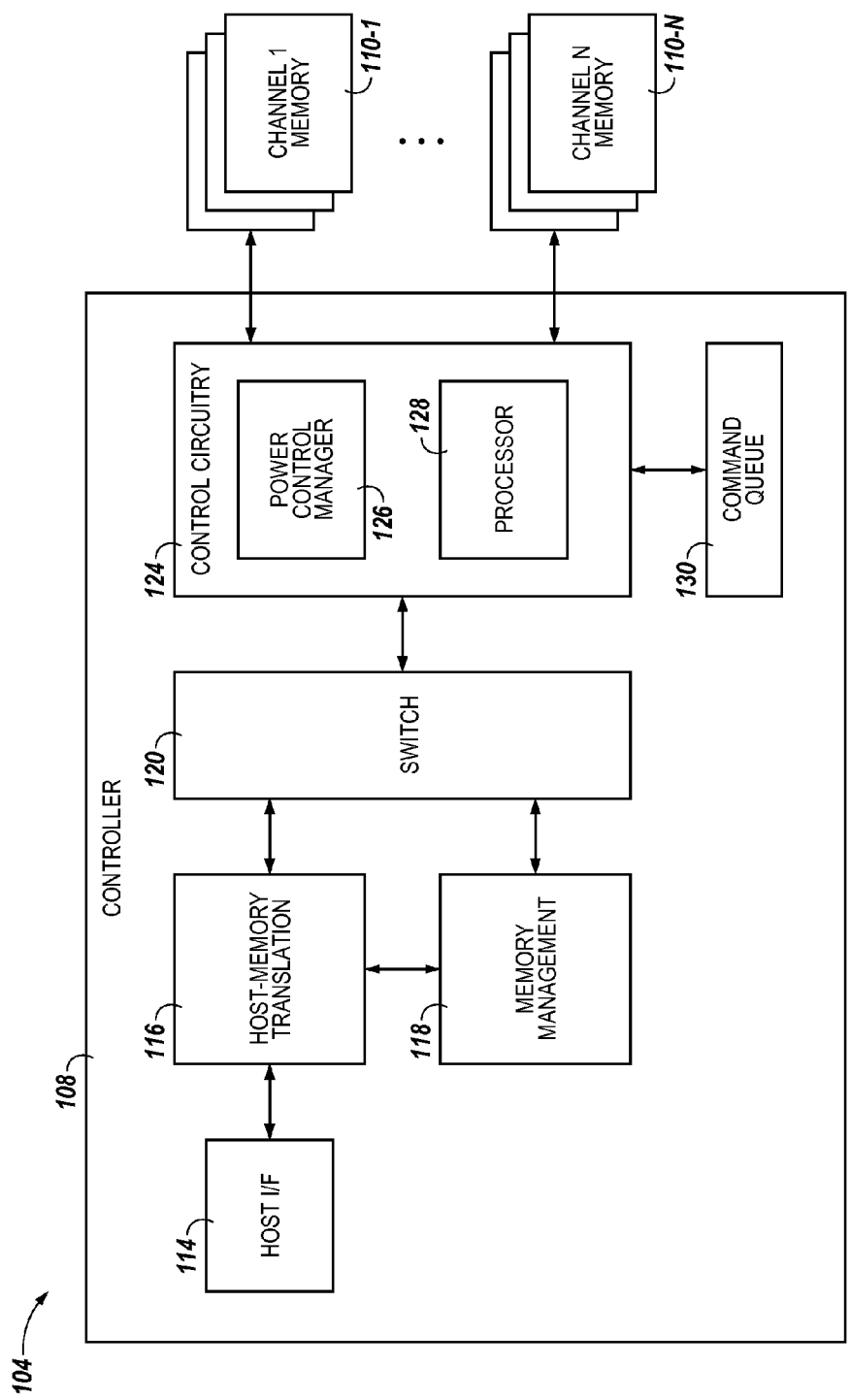
FIG. 1 is a functional block diagram of an apparatus in the form of a memory system in accordance with a number of embodiments of the present disclosure.

The present disclosure includes apparatuses and methods for apparatus power control. A number of embodiments include determining a power profile for each of a number of commands in a command queue that are ready for execution and selecting a portion of the number of commands in the command queue for execution based on the power profiles of the number of commands to control power consumption in the apparatus.

In a number of embodiments, a power control manager can select commands in a command queue for execution to control power consumption of memory devices during execution of the commands. The power control manager can analyze power profiles of the commands to select commands for execution so that a memory system consumes no more than a particular amount of power when executing the selected commands. The memory system can be controlled by the power control manager to consume power at no more than a particular average power level and/or at a peak power level for no more than a particular amount of time. For example, the power control manager can select commands to control power consumption based on information in the power profile, such as the command type, the number of commands in the command queue, memory device parameters, and/or length of time in the command queue, e.g. the age of the command, among other information.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things. For example, a number of memory devices can refer to one or more memory devices. As used herein, the designators "M", "N,", "P", "R", and "S", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of an apparatus in the form of a memory system 104 in accordance with a number of embodiments of the present disclosure. As used herein, a memory system 104, a controller 108, or a memory device 110 might also be separately considered an "apparatus." The memory system 104 can be used as an external, e.g., portable, memory system for a computing system. The memory system 104, e.g., a solid state drive (SSD), can include controller 108 coupled to memory, e.g., a number of solid state memory devices 110-1, . . . , 110-N. The solid state memory devices 110-1, . . . , 110-N can provide a storage volume for the memory system 104. In a number of embodiments, the number of memory devices 110-1, . . . , 110-N can include non-volatile memory including a number of logical units (LUNs). A LUN can be a portion of non-volatile memory that can be independently controllable. Also, the controller can include volatile and/or non-volatile memory.

A solid state memory device 110-1, . . . , 110-N can include a number of arrays of memory cells, e.g., non-volatile memory cells. The arrays can be flash arrays with a NAND architecture, for example. In a NAND architecture, the control gates of memory cells of a "row" can be coupled with an access, e.g., word, line, while the memory cells can be coupled in series source to drain in a "string" between a select gate source transistor and a select gate drain transistor. The string can be connected to a data, e.g., bit, line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The solid state memory devices 110-1, . . . , 110-N can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included one a die. As an example, a 128 GB memory device can store 4320 bytes of information per page, 128 pages per block, 2048 blocks per plane, and 16 planes per device. In FIG. 1, channel 1 memory 110-1 can include a number of dies of memory cells that are coupled to the memory system 104 via channel 1 and channel N memory 110-N can include a number of dies of memory cells that are coupled to the memory system 104 via channel N.

In a number of embodiments, the controller 108 can be an application specific integrated circuit (ASIC), where the controller 108, e.g., in the form of an ASIC, is coupled to a printed circuit board including the solid state memory devices 110-1, . . . , 110-N and host interface (I/F) 114. Host I/F 114 can be used to communicate information between the memory system 104 and another device such as a host (not shown). A host can include a memory access device, e.g., a processor. One of ordinary skill in the art will appreciate that "a processor" can intend a number of processors, such as a parallel processing system, a number of coprocessors, etc. Example hosts include laptop computers, personal computers, digital cameras, digital recording and playback devices, mobile telephones, PDAs, memory card readers, interface hubs, and the like. In a number of embodiments, host I/F 114 can include a physical interface in the form of a standardized physical interface. For example, host I/F 114 can include a serial advanced technology attachment (SATA) physical interface, a peripheral component interconnect express (PCIe) physical interface, a small computer system interface (SCSI) interface, a serial attachment SCSI (SAS) interface, or a universal serial bus (USB) physical interface, among other interfaces. In general, however, host I/F 114 can provide an interface for passing control, address, information, e.g., data, and other signals between the memory system 104 and a host having compatible receptors for the host I/F 114.

The controller 108 can communicate with the solid state memory devices 110-1, . . . , 110-N to read, write, and erase information, among other operations. The controller 108 can have firmware and/or circuitry that may be a number of integrated circuits and/or discrete components. For a number of embodiments, the circuitry in controller 108 may include control circuitry, e.g. control circuitry 224, for controlling access across the solid state memory devices 110-1, . . . , 110-N and circuitry for providing a translation layer between a host and the memory system 104. Thus, a controller could selectively couple an I/O connection (not shown in FIG. 1) of a solid state memory device 110-1, . . . , 110-N to receive the appropriate signal at the appropriate I/O connection at the appropriate time. Similarly, the communication protocol between a host and the memory system 104 may be different than what is required for access of a solid state memory device 110-1, . . . , 110-N. Controller 108 could then translate the commands received from a host into the appropriate commands to achieve the desired access to a solid state memory device 110-1, . . . , 110-N.

The controller 108 can include host interface (I/F) 114, host-memory translation circuitry 116, memory management circuitry 118, a switch 120, a command queue 130, and/or control circuitry 124. As described herein, portions of controller 108 can be provided in the form of an ASIC, however, embodiments are not so limited.

The control circuitry 124, e.g., non-volatile memory control circuitry, can be coupled to the switch 120 and to a number of non-volatile memory devices 110. In some embodiments, the controller 108 can include control circuitry, such as control circuitry 124, for all memory channels. In other embodiments, each memory channel can be coupled to discrete control circuitry. Control circuitry 124 can include processor 128 to execution instructions, e.g., software and/or firmware, according to a number of embodiments of the present disclosure. While the control circuitry 124 can include a processor 128, a number of embodiments of the present disclosure provide for control of memory operations in circuitry, e.g., hardware, without relying on the execution of instructions, e.g., software and/or firmware, by the processor 128. Such embodiments can provide for faster memory operations relative to some previous approaches that rely more heavily on a processor to control memory operations.

The control circuitry 124 can receive commands, such as read, write, and/or erase commands, from a host, e.g., via host I/F 114, and/or commands from memory management circuitry 118, e.g., in association with wear leveling operations. The commands that the control circuitry 124 receives, e.g., via switch 120, are ready for execution by the memory devices 110. The received commands can be placed in a command queue 130. The commands in command queue 130 can include information such as the command type, the length of time the command has been in the command queue 130, e.g., the age of the command, and the channel and/or memory device on which the command is to be executed. The information about the commands in command queue 130 can be used by a power control manager 126 to determine, e.g., create, a power profile for each command in the command queue 130, which is described in further detail in association with FIG. 2B.

Power control manager 126 can monitor the power consumption of the commands in a selected command queue. The power consumed by the commands in the selected command queue can be monitored and commands from command queue 130 can be placed into the selected command queue to control the power consumed by the memory system 104. Once commands are in the selected command queue, they are executed by the memory system 104. The control circuitry 124 can enable each channel that is associated with a command placed in the selected command queue. For example, as commands are received in the command queue 130 and as commands from the selected command queue are executed and removed from the selected command queue, the power control manager 126 can place commands from command queue 130 into the selected command queue for execution to control power consumption of the memory system 104. Power control manager 126 can select commands in command queue 130 for execution by analyzing the power profiles of the commands in command queue 130 and the commands in a selected command queue. Power control manager 126 can select commands in the command queue 130 for execution and place the selected commands in the selected command queue to control power consumption of the memory system 104 during execution of the selected commands based on the analysis of the power profiles of the commands in command queue 130 and the commands in a selected command queue. At particular time intervals, the selected command queue can be analyzed to determine the amount of power the commands in the selected command queue will consume. Based on the analysis of the selected command queue, commands from command queue 130 can be analyzed and placed in the selected command queue to control power consumption of the memory system 104.

For example, power control manager 126 can select commands for execution to control power consumption based on information in the power profiles, such as the command type, the number of commands in the command queue, the temperature of the memory system, memory device parameters, and/or length of time in the command queue, e.g. the age of the command, among other information. The power control manager 126 can, for example, select commands in the command queue for execution by summing the power profiles of a number of different combinations of commands in the command queue. The power control manager 126 can select one of the number of different combinations of commands for execution based on the sum of the power profiles for that combination and the sum of the power profiles of the commands in the selected command queue. The power control manager 126 can analyze the sum of the power profiles of each of the number of different combinations of commands to determine and select the combination of commands that will consume no more than a particular amount of power, such as power at an average power level and/or at a peak power level for a particular period of time, for example, when executing the selected combination of commands. The power control manager 126 can update the power profiles for the commands in command queue 130 as commands are received by the control circuitry 124 and/or executed by the memory devices 110.

The host I/F 114 can include a physical interface to couple the memory system 104 to a host. The host I/F 114 can include a peripheral component interconnect express (PCIe) circuit providing a physical layer, link layer, and transport or transaction layer interface, e.g., where the host is configured to transmit information according to a PCIe standard. In a number of embodiments, the host I/F 114 can be coupled to host-memory translation circuitry 116.

In general, the host I/F 114 can include circuitry that is responsible for converting command packets received from the host, e.g., from a PCIe bus, into command instructions for the host-memory translation circuitry 116 and for converting host-memory translation responses into host commands for transmission to the requesting host. For example, the host I/F 114 can construct SATA command packets from PCIe based transaction layer packets. In a number of embodiments, the number of commands that are provided to controller 108, e.g. via host I/F 114, can be throttled based on the ability of the memory system 104 to execute commands, for instance.

The host-memory translation circuitry 116 can be coupled to the host I/F 114, to the memory management circuitry 118, and/or to the switch 120. The host-memory translation circuitry 116 can be configured to translate host addresses to memory addresses, e.g., addresses associated with a received command such as a read and/or write command. The host-memory translation circuitry 116 can include error detection/correction circuitry, such as RAID exclusive or (XOR) circuitry. The RAID XOR circuitry can calculate parity information based on information received from the host I/F 114.

The memory management circuitry 118 can be coupled to the host-memory translation circuitry 116 and/or to the switch 120. The memory management circuitry 118 can control a number of processes including, but not limited to, initialization, wear leveling, e.g., garbage collection and/or block reclamation, and error correction, e.g., via operation of a processor. The memory management circuitry 118 can implement wear leveling, e.g., garbage collection and/or reclamation, to control the wear rate on the solid state memory devices 110-1, . . . , 110-N. A solid state memory array can experience errors, e.g., failures, after a number of program and/or erase cycles, for instance. Wear leveling can reduce the number of program and/or erase cycles performed on a particular group by spreading the cycles more evenly over the entire array. Static wear leveling includes writing static information to blocks that have high erase counts to prolong the life of the block. Wear leveling can include dynamic wear leveling to minimize the amount of valid blocks moved to reclaim a block. Dynamic wear leveling can include a technique called garbage collection. Garbage collection can include reclaiming, e.g., erasing and making available for writing, blocks that have the most invalid pages, e.g., according to a "greedy algorithm." Alternatively, garbage collection can include reclaiming blocks with more than a threshold amount of invalid pages. If sufficient free blocks exist for a writing operation, then a garbage collection operation may not occur. An invalid page, for example, can be a page of information that has been updated to a different page.

Write amplification is a process that may occur when writing information to solid state memory devices 110-1, . . . , 110-N. When randomly writing information in a memory array, the solid state memory system controller 108 scans for available space in the array. Available space in a memory array can be individual cells, pages, and/or blocks of memory cells that are not storing information and/or have been erased. If there is enough available space to write the information in a selected location, then the information is written to the selected location of the memory array. If there is not enough available space in the selected location, the information in the memory array is rearranged by reading, copying, moving, or otherwise rewriting and erasing the information that is already present in the selected location to a new location, leaving available space for the new information that is to be written in the selected location. The rearranging of old information in the memory array is called write amplification because the amount of writing performed by the memory device is amplified over an amount of writing that would occur if there were sufficient available space in the selected location.

Memory management circuitry 118 can access memory devices 110 to determine candidates for wear leveling. The memory management circuitry 118 can update a logical block address (LBA) table (not shown) with a new physical address corresponding to a logical address when data associated with the logical address is written to the new physical address, e.g., as part of wear leveling or an update to the data.

The switch 120 can be coupled to the host-memory translation circuitry 116, the memory management circuitry 118, and/or the control circuitry 124. The switch 120 can be a crossbar switch and can include and/or be coupled to one or more buffers, e.g., static random access memory (SRAM) buffers. The switch 120 can provide an interface between various components of the controller 108. The switch 120 can account for variations in defined signaling protocols that may be associated with different components of the controller 108 in order to provide consistent access and implementation between components. In one or more embodiments, the switch 120 can comprise a direct memory access (DMA) module.

The memory system 104 illustrated in FIG. 1 can include additional circuitry beyond what is illustrated. The detail of the memory system 104 illustrated in FIG. 1 has been reduced so as not to obscure embodiments of the present disclosure. For example, the memory system 104 can include address circuitry to latch address signals provided over I/O connections through I/O circuitry. Address signals can be received and decoded by a row decoder and a column decoder to access the solid state memory devices 110-1, . . . , 110-N. It will be appreciated by those skilled in the art that the number of address input connections can depend on the density and architecture of the solid state memory devices 110-1, . . . , 110-N.

Figure 2A:
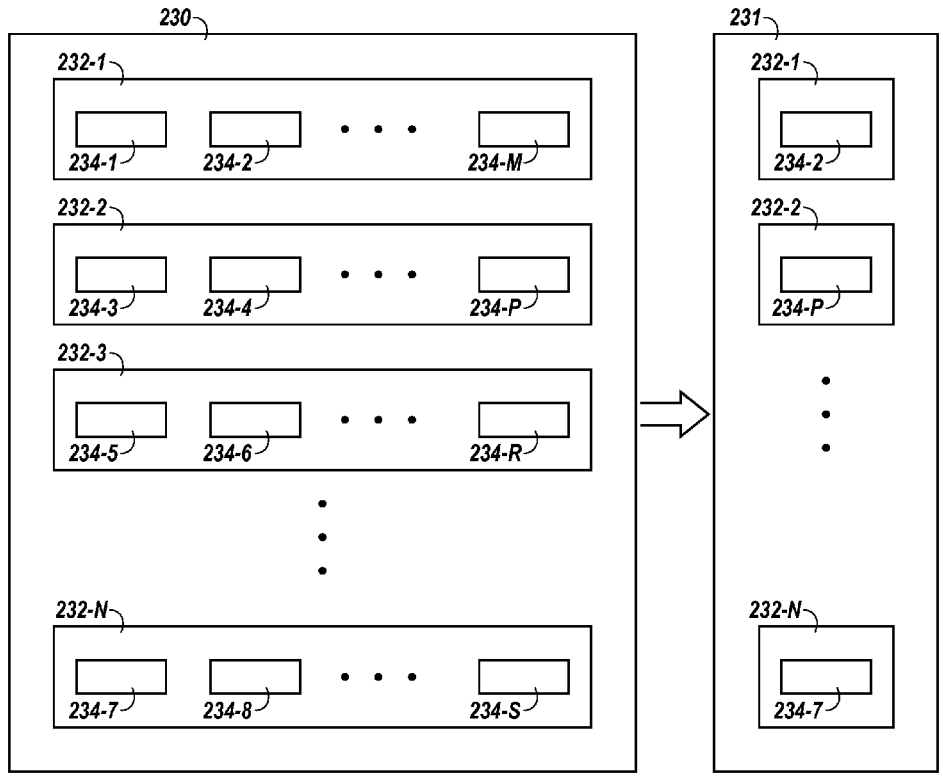
FIG. 2A illustrates a command queue of a memory system in accordance with a number of embodiments of the present disclosure.

FIG. 2A illustrates a command queue of a memory system in accordance with a number of embodiments of the present disclosure. In FIG. 2A, command queue 230 includes a number of channel queues 232-1, . . . , 232-N. Each of the channel queues 232-1, . . . , 232-N are associated with a channel that is coupled to a number of memory devices. For example, channel queue 232-1 can be associated with the channel that is coupled to a number of memory devices 110-1 in FIG. 1 and channel queue 232-N can be associated with the channel that is coupled to a number of memory devices 110-N in FIG. 1. Each of the channel queues 232-1, . . . , 232-N include a number of commands ready for execution. For example, channel queue 232-1 includes commands 234-1, 234-2, . . . , 234-M. Channel queue 232-2 includes commands 234-3, 234-4, . . . , 234-P. Channel queue 232-3 includes commands 234-5, 234-6, . . . , 234-R. Channel queue 232-N includes commands 234-7, 234-8, . . . , 234-S. The commands 234 in command queue 230 are ready for execution and have been placed in command queue 230, e.g., by control circuitry such as control circuitry 124 in FIG. 1.

Figure 2B:
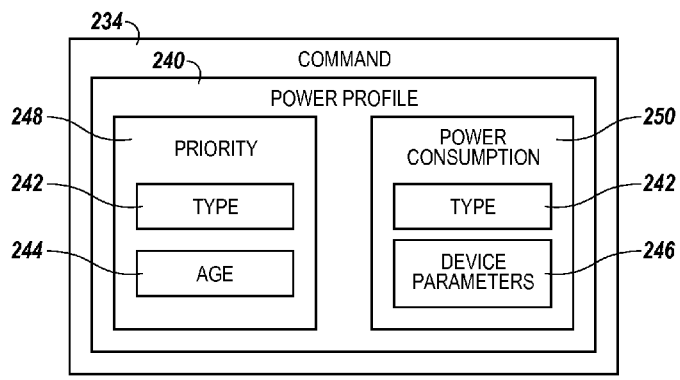
FIG. 2B illustrates a power profile associated with a command in accordance with a number of embodiments of the present disclosure.

In a number of embodiments, once the commands are placed in the command queue 230, the commands can be selected for execution by a power control manager, e.g., power control manager 126 in FIG. 1, and executed by the number of memory devices, e.g., memory devices 110-1, . . . , 110-N in FIG. 1. A power control manager can select commands from command queue 230 and place commands in a selected command queue 231 for execution. In FIG. 2B, the selected commands 234-2, 234-P, and 234-7 can be placed in selected command queue 231 based on an analysis of their power profiles by the power control manager. The selected commands are chosen such that power consumption of the memory system during the execution of commands 234-2, 234-P, and 234-7 can be at a particular power level, such as no more than an average power level and/or at a peak power level for no more than a particular time period, for example. The commands 234-2, 234-P, and 234-7 can be executed on memory devices that are coupled to their respective channel. For example, command 234-2 can be executed on a memory device coupled to channel 1, command 234-P can be executed on a memory device coupled to channel 2, and command 234-7 can be executed on a memory device coupled to channel N. In the example illustrated in FIG. 2A, the commands 234-2, 234-P, and 234-7 can be executed approximately simultaneously, as each command can travel on their respective channel to the memory devices for execution. The power control manager can place commands in the selected command queue 231 to control the power consumption of the memory system, such as memory system 104 in FIG. 1, such that an average power level and/or a peak power level for a particular time period is achieved.

FIG. 2B illustrates a power profile 240 associated with a command 234 in accordance with a number of embodiments of the present disclosure. In a number of embodiments, each of the commands in a command queue can have a power profile associated therewith. The power profile 240 associated with command 234 can be based on the command type 242, the age of the command 244, and/or memory device parameters 246, among other factors.

In a number of embodiments, power profile 240 can include power consumption information 250 and/or priority information 248. The power consumption information 250 can be based on information such as the command type 242 and/or memory device parameters 246. The priority information 248 can be based on information such as the command type 242 and/or the age of the command 244. A power control manager can use the command type 242, the age of the command 244, and/or memory device parameters 246 to determine, e.g., calculate, the power consumption information 250 and/or the priority information 248 of power profile 240 for command 234. The power consumption information 250 and/or priority information 248 of each power profile 240 for commands in a command queue can be analyzed to determine which commands will be selected for execution. The power control manager can select commands for execution so that a memory system consumes no more than a particular amount of power. For example, the power control manager can select commands for execution so that a memory system consumes power at no more than an average power level and/or at a peak power level for no more than a particular period of time when executing the selected commands.

In a number of embodiments, it can be beneficial to operate a memory system to maintain power consumption of the memory system at or below a threshold power level. The threshold power level can be used to determine an average power level at which to operate the memory system to maintain power consumption of the memory system at or below the threshold power level. Also, the memory system can be allowed to consume power at a level above the average power level, e.g., a peak power level, for no more than a particular period of time, such as 100 nanoseconds (ns) to 100 milliseconds (ms), for example. The average power level, the peak power level, and/or the particular period of time for the peak power level can be adjusted and controlled by firmware and/or software in the power control manager. In a number of embodiments, after the memory devices have performed at the peak power level for the particular period of time, the power control manager can limit the power consumption of the memory devices to below the average power level to compensate for performing at the peak power level.

The command type 242 can include read commands, write commands, and/or erase commands. The amount of power consumed by the memory devices when executing a command can vary by command type. The power control manager can use the command type 242 information to help determine the amount of power that the command will consume when determining power consumption information 250 for the power profile 240.

The power control manager can use the command type 242 to determine priority information 248 of the power profile 240. In a number of embodiments, the power control manager can prioritize execution of commands using priority information based on the command type, for instance. For example, power control manager can use priority information to execute all write commands first, all read commands next, and all erase commands last. The power consumption information 250 and/or priority information 248 of the power profile 240 based on the device type 242 can be adjusted and controlled by firmware and/or software in the power control manager.

The age of the command 244 can include information indicating the amount of time that the command has been in the command queue. In a number of embodiments, the power control manager can prioritize execution of commands using priority information based on the age of the commands, for instance. For example, power control manager can use priority information to execute commands from oldest to youngest and/or the power control manager can weigh the priority information based the age of the commands. The priority information 248 of the power profile 240 based on the age of the command 244 can be adjusted and controlled by firmware and/or software in the power control manager.

The device parameters 246 can include information about how much power a memory device will consume when executing a command. The amount of power consumed by the memory devices when executing a command can vary based on device parameters, such as the type of memory cell in a memory device. For example, the amount of power consumed by a memory device can vary for single level cells (SLCs) and multi-level cells (MLCs). The power control manager can use information from device parameters 446 to help determine the amount of power that the command will consume when determining power consumption information 250 for the power profile 440.

The power control manager can use the device parameters 246 to determine priority information 248 of the power profile 240. In a number of embodiments, the power control manager can prioritize execution of commands using priority information based on device parameters, for instance. For example, power control manager can use priority information to execute commands on SLCs first and commands on MLCs last. The power consumption information 250 and/or priority information 248 of the power profile 240 based on device parameters 242 can be adjusted and controlled by firmware and/or software in the power control manager.

CONCLUSION

The present disclosure includes apparatuses and methods for apparatus power control. A number of embodiments include determining a power profile for each of a number of commands in a command queue that are ready for execution and selecting a portion of the number of commands in the command queue for execution based on the power profiles of the number of commands to control power consumption in the apparatus.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for controlling power in an apparatus, comprising:
   determining a power profile for each of a number of commands in a command queue that are ready for execution, wherein the power profile for each of the number of commands includes power consumption information; and
   selecting a portion of the number of commands in the command queue for execution based on the power profiles of the number of commands to control power consumption in the apparatus such that a particular average power level for the apparatus is achieved.

2. The method of claim 1, wherein the method includes selecting an additional number commands in the command queue for execution to control power consumption of the apparatus such that a peak power level for a particular amount of time is achieved.

3. The method of claim 1, wherein determining a power profile for each of a number of commands comprises determining the power profile for a respective one of the number of commands using a type of the respective command.

4. The method of claim 1, wherein determining a power profile for each of a number of commands comprises determining the power profile for a respective one of the number of commands using a length of time the respective command has been in the command queue.

5. The method of claim 1, wherein determining a power profile for each of a number of commands comprises determining the power profile for a respective one of the number of commands using a parameter associated with a channel and/or memory device on which the respective command is to be executed.

6. The method of claim 1, wherein selecting the portion of the number commands in the command queue for execution comprises selecting the portion of the number of commands based on a temperature of the apparatus.

7. The method of claim 1, wherein the method includes executing the portion of the number of commands that were selected.

8. The method of claim 1, wherein determining the power profile for each of the number of commands in the command queue that are ready for execution comprises determining the power profile at a controller.

9. A method for controlling power in an apparatus, comprising:
   receiving a number of commands ready for execution in a command queue;
   determining a power profile for each of the number of commands; and
   selecting a portion of the number of commands for execution based on the determined power profiles by analyzing the power profiles to determine a combination of commands that when executed consume power at a particular level that is no more than a particular average power level.

10. The method of claim 9, wherein analyzing the power profiles includes determining a combination of commands that when executed consume power at a level that is no more than a particular average power level.

11. The method of claim 9, wherein analyzing the power profiles includes determining a combination of commands that when executed consume power at a peak level for no more than a particular period of time.

12. The method of claim 9, wherein analyzing the power profiles includes prioritizing a respective one of the commands based on a length of time the respective command has been in the command queue.

13. The method of claim 9, wherein analyzing the power profiles includes prioritizing the commands based on command type and device parameters.

14. The method of claim 9, wherein selecting the portion of the number of combinations for execution is responsive to the sum of all the power profiles being greater than a particular average power level.

15. An apparatus, comprising:
   a number of memory cells; and
   a controller coupled to the number of memory cells and configured to:
      determine a power profile for each command of a number of commands in a command queue that are ready for execution;
      determine a sum of the power profiles for each of a number of combinations of commands to determine an amount of power the apparatus will consume during execution of each combination of commands; and
      select one of the number of combinations of commands for execution based on the amount of power the apparatus will consume during execution of the selected combination of commands, wherein the selected combination of commands consume an amount of power that is no more than a particular average power level.

16. The apparatus of claim 15, wherein the controller is configured to update the power profiles as commands are executed.

17. The apparatus of claim 15, wherein the controller is configured to update the power profiles as commands are received by the controller.

18. A method for controlling power in an apparatus, comprising:
   receiving a number of commands ready for execution in a command queue;
   determining a power profile for each of the number of commands; and
   selecting a portion of the number of commands for execution based on the determined power profiles by analyzing the power profiles to determine a combination of commands that when executed consume power at a particular level, wherein selecting the portion of the number of combinations for execution is responsive to the sum of all the power profiles being greater than a particular average power level.

19. An apparatus, comprising:
   a number of memory cells; and
   a controller coupled to the number of memory cells and configured to:
   determine a power profile for each command of a number of commands in a command queue that are ready for execution;
   determine a sum of the power profiles for each of a number of combinations of commands to determine an amount of power the apparatus will consume during execution of each combination of commands; and
   select one of the number of combinations of commands for execution based on the amount of power the apparatus will consume during execution of the selected combination of commands, wherein the selected combination of commands consume an amount of power that is greater than a particular average power level for no more than a particular period of time.

* * * * *